United States Patent
Han

(10) Patent No.: US 6,378,103 B1
(45) Date of Patent: Apr. 23, 2002

(54) APPARATUS AND METHOD FOR ERROR CORRECTION IN OPTICAL DISK SYSTEM

(75) Inventor: Gyoo-wan Han, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/298,732

(22) Filed: Apr. 23, 1999

(30) Foreign Application Priority Data

May 19, 1998 (KR) .......................................... 98-17994

(51) Int. Cl.[7] .............................................. G11C 29/00
(52) U.S. Cl. ...................................... 714/769; 714/781
(58) Field of Search ........................ 714/763, 764–773, 714/752, 753–756, 746, 747–751

(56) References Cited

U.S. PATENT DOCUMENTS

| | | | |
|---|---|---|---|
| 4,336,612 A | * 6/1982 | Inoue et al. ................. | 714/755 |
| 4,868,828 A | 9/1989 | Shao et al. .................... | 371/5.1 |
| 4,873,688 A | 10/1989 | Maki et al. .................. | 371/37.1 |
| 5,084,891 A | * 1/1992 | Ariyavisitakul et al. .... | 714/775 |
| 5,099,482 A | 3/1992 | Cameron ..................... | 371/37.1 |
| 5,570,378 A | 10/1996 | Inoue et al. ................. | 371/37.1 |
| 5,608,740 A | * 3/1997 | Watanabe .................... | 714/755 |
| 5,689,727 A | * 11/1997 | Bonke et al. .................. | 710/20 |
| 5,691,994 A | * 11/1997 | Acosta et al. ................ | 714/758 |
| 5,812,564 A | * 9/1998 | Bonke et al. ................ | 714/769 |

* cited by examiner

*Primary Examiner*—David Ton
*Assistant Examiner*—Emeka J. Amanze
(74) *Attorney, Agent, or Firm*—Mills & Onello LLP

(57) ABSTRACT

An apparatus and method for error correction in an optical disk system are described. An optical disk reproducing system calculates syndromes for each codeword to set an eraser flag during EFM demodulation. Error-correction-coding is performed using the eraser flag after completion of EFM-demodulation to reduce the access time for a data memory in error correction, thus reducing the time of error correction. The system includes a data memory for storing the EFM signals and the EFM-demodulated signals in the unit of an error correction block, an EFM demodulation and syndrome calculator for EFM-demodulating the EFM signals to output the EFM-demodulated signals to the data memory, and for calculating syndromes of the EFM-demodulated signals in the unit of the first codeword and outputting a flag indicating errors. A flag memory stores the first predetermined number of flags with respect to each of the first predetermined number of the first codewords, and an error corrector error-correction-decodes the EFM-demodulated signal stored in the data memory in the unit of an error correction block based on the flags stored in the flag memory.

6 Claims, 10 Drawing Sheets

APPARATUS AND METHOD FOR ERROR CORRECTION IN OPTICAL DISK SYSTEM

BACKGROUND OF THE INVENTION

1. Field of the Invention

The present invention relates to an optical disk reproduction system, and more particularly, to an apparatus and method for error-correction-decoding in an optical disk reproduction system.

2. Description of the Related Art

A digital versatile disk or a digital video disk (DVD) is a storing medium which realizes higher storage capacity than, while maintaining most characteristics of, a compact disk (CD). The DVD can store moving image data with high resolution, to thereby supply various moving images such as those found in a motion picture. The DVD player can therefore be considered analogous to a video cassette player. Also, the DVD can be used as an auxiliary memory in an information processing system such as a computer for storing large amounts of data.

A typical DVD system for reproducing information stored in the DVD is shown in FIG. 7. Referring to FIG. 7, data of a disk 210 read out by a pickup 212 is amplified by an RF amplifier and equalizer 214 and is concurrently equalized to compensate for deterioration of signals. A data slicer 216 reproduces digital data from an analog signal output by the RF amplifier and equalizer 214. A synchronization detector 218 receives the digital data and detects a synchronization signal of the data. An eight-to-fifteen modulation (EFM) demodulator 220 EFM-demodulates the digital data in accordance with the synchronization signal, and stores the demodulated signal in a data memory 232. An error correction code (ECC) decoder 222 error-correction-decodes the demodulated signal stored in the memory in a unit of an ECC block, to thereby output the decoded signals.

If the DVD system is used to reproduce image data, the decoded signal of the ECC decoder 222 is output to an MPEG-2 decoder 224. The MPEG-2 decoder 224 decodes image data coded according to the MPEG-2 standard, to thereby output the decoded signal to an image display apparatus such as the television. Meanwhile, if the DVD system is used in connection with a DVD-ROM system for reproducing data, the decoded signal of the ECC decoder 222 is output to a host interface 226, and the host interface 226 transmits the received data to an information processing system such as a computer (PC).

When the DVD system is used as a DVD-ROM system, preferably, the DVD-ROM system must operate at high speed to reduce data access time in the computer. But, in the system of FIG. 7, the decoding operation of the ECC decoder 222 requires a lot of time. Accordingly, the time for error correction decoding must be shortened as much as possible, for example, by operating the DVD-ROM system at high speed, to reduce the access time of the DVD.

The error correction decoding of the conventional DVD system will be described with reference to FIGS. 8 through 10. Information data of the DVD system is double-coded by a Reed-Solomon code in each error correction code (ECC) block to increase reliability of the data. FIG. 8 shows the structure of the ECC block in the DVD. In each ECC block, the information data of 172 bytes is inner-coded by adding internal parity data of 10 bytes, and 192 inner-coded codewords are added to 16 rows of outer parity data, to be outer-coded. Thus, the double-coded data of 182×208 bytes form one ECC block. Thus, the one ECC block includes an information region of 172×192 bytes, an inner parity (PI) data region of 10×192 bytes, and an outer parity (PO) data region of 172×16 bytes.

In general, when a parity is added to k message symbols and thus (n, k, d+1) Reed-Solomon code coded by n symbols is used, d/2 errors or d eraser can be corrected. Here, the error denotes the case in which a position and a value are unknown, and the eraser denotes the case in which the position is known and the value is unknown. Thus, in the codeword coded by (182, 172, 11) Reed-Solomon code as shown in FIG. 8, five errors or ten erasers can be corrected. Also, in the codeword coded by (208, 192, 17) Reed-Solomon code, eight errors or sixteen erasers can be corrected.

In general, if the error correction decoding with respect to the ECC block is performed, the error is corrected using the PI data, and then the error is corrected using the PO data. Also, in order to increase the error correction probability, the correction can be repeated using the PI or PO data.

An error correction decoding method with respect to the ECC block will be briefly described. A "syndrome" with respect to EFM-decoded data stored in a data memory is calculated, to check whether there is an error or not. Then, an eraser position formula required for correcting the eraser is obtained, and the eraser position formula is multiplied by the syndrome formula, to obtain a modified syndrome formula. The error position formula and the error value estimation formula are calculated by a Euclidean algorithm or a Barlekamp algorithm, using the syndrome formula, the eraser position formula and the modified syndrome formula. Also, the position in which an error is generated is calculated by using the error position formula, and the error value is calculated using the error position formula and the error estimation formula. At this time, it is determined whether the error of each of the codewords can be corrected, to thereby store the determined result as a flag. Finally, the error in the data is corrected according to the error position and the error value.

FIGS. 9 and 10 show a method of operating the data memory in a conventional optical disk reproducing apparatus. The data memory is divided into three parts. Data of one EFM-demodulated ECC block is recorded in the A-region. While the ECC block data recorded in the A-region is ECC-decoded, the other ECC block data is EFM-demodulated to be recorded in the B-region of the data memory. Also, while the ECC block data of the A-region in which ECC decoding is completed is output, the ECC block of the B-region is ECC-decoded and the other ECC block data is EFM-demodulated, to be recorded in the C-region of the data memory. While the ECC block data of the B-region in which the ECC decoding is completed is output, the ECC block of the C-region is ECC-decoded and the other ECC block data is EFM-demodulated, to be recorded in the A-region of the data memory.

In order to reduce the decoding time in the error correction decoding apparatus, in the error correcting apparatus of U.S. Pat. No. 5,570,378 written by Inoue Sadayuki et al., a method of using a higher clock frequency for an error value calculator having increased processing capability is disclosed. However, in the above ECC decoding process, the access time for a data memory 232 as well as the operation speed have effects on the decoding time.

In the process of ECC decoding, the data memory is accessed when the syndrome is calculated and errors are corrected. As shown in FIG. 8, if ECC block data is inner-coded by (182, 172, 11) Reed-Solomon code and outer-coded by (208, 192, 17) Reed-Solomon code, the data memory is accessed 37,856 (=182×208) times during the process of calculating the syndrome. Also, since an error of 5 per codeword can be corrected in final correction, the data memory 232 is accessed a maximum 2,028 (=5×2×208) times to read and record during error correction. Thus, if the error is corrected using PI data, the data memory is accessed a maximum 40,768 (=37,856+2,028) times. If the eraser instead of the error is corrected, the number of accesses of the data memory for correction is greater.

The access time for the data memory can be reduced by increasing a clock frequency. But, since there is a limit to the operation frequency of the data memory including a DRAM, there is a limit to the amount the access speed of the memory can be increased.

SUMMARY OF THE INVENTION

To solve the above problem, it is an objective of the present invention to provide an optical disk reproducing system for calculating syndromes for each codeword to set an eraser flag, during EFM demodulation, and performing error-correction-coding using the eraser flag after completion of EFM-demodulation, to reduce the access time for a data memory in performing error correction and thus reduce the time of error correction.

It is another objective of the present invention to provide a method for EFM demodulation and error correction of an optical disk reproducing system calculating syndromes for each codeword to set an eraser flag and performing error-correction-coding using the eraser flag after completion of EFM-demodulation.

Accordingly, to achieve the first objective, there is provided an optical disk reproducing system reading signals stored in the optical disk, restoring EFM signals, demodulating the EFM signals to restore predetermined error correction block double-coded by coding a first predetermined number of messages each having a second predetermined number of symbols to a first plurality of codewords, using first parity data and to a second plurality of codewords using second parity data in the direction vertical to coding by the first parity data, and error-correction-decoding in a unit of error correction block. The system includes a data memory for storing the EFM signals and the EFM-demodulated signals in the unit of an error correction block. An EFM demodulation and syndrome calculator EFM-demodulates the EFM signals to output the EFM-demodulated signals to the data memory, and calculates syndromes of the EFM-demodulated signals in the unit of the first codeword and outputs a flag indicating whether there is an error. A flag memory stores the first predetermined number of flags with respect to each of the first predetermined number of the first codewords. An error corrector error-correction-decodes the EFM-demodulated signal stored in the data memory in the unit of an error correction block based on the flags stored in the flag memory.

To achieve the second objective, there is provided a method for EFM demodulation and error correction decoding of an optical disk reproducing system restoring EFM-demodulated EFM signals, demodulating the EFM signals to restore predetermined error correction block double-coded by coding a first predetermined number of messages each having a second predetermined number of symbols to a first plurality of codewords using first parity data and to a second plurality of codewords using second parity data in the direction vertical to coding by the first parity data, and error-correction-decoding in a unit of error correction block. The method includes the steps of EFM-demodulating the EFM signals and calculating syndromes of the EFM-demodulated signal in a unit of the first codeword to determine whether there is an error. A first flag is set when there is an error. An error-correction-decoding of the EFM-demodulated signal is performed in a unit of the error correction block, using the first flag for the first plurality of codewords.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
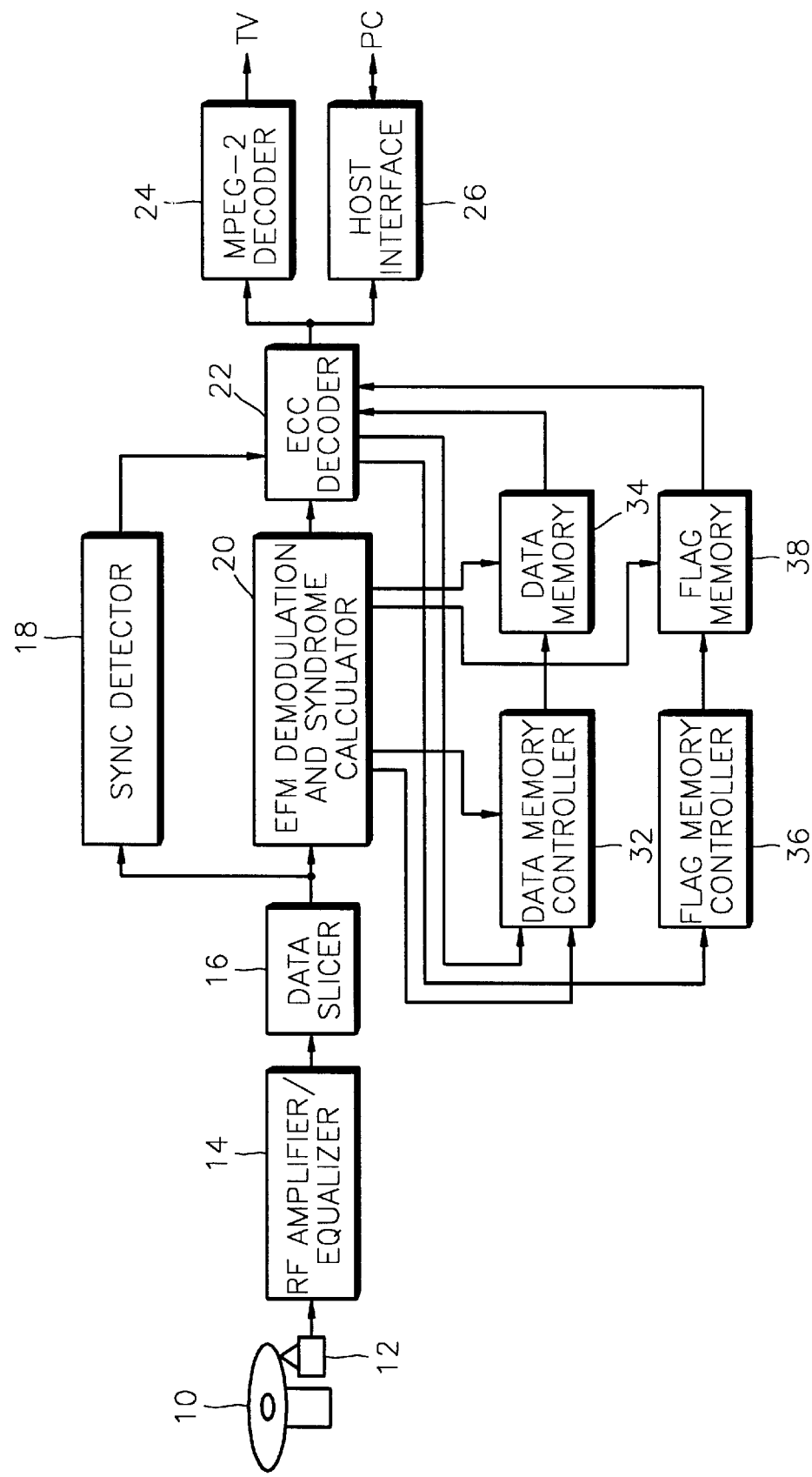
FIG. 1 is block diagram of one embodiment of a digital versatile disk (DVD) system according to the present invention.

Referring to FIG. 1, in accordance with the invention, an RF amplifier and equalizer 14 receives a data signal read from a disk 10 by a pickup 12, and amplifies and concurrently equalizes the signal in RF amplifier and equalizer 14 to compensate for deterioration of the signal. A data slicer 16 restores an EFM-modulated digital data signal from the signals output by the RF amplifier and equalizer 14. A synchronization detector 18 receives the EFM digital data and detects a synchronization signal of the data. An EFM demodulation and syndrome calculator 20 EFM-demodulates the EFM digital data signal in synchronization with the synchronization signal, and stores the demodulated signal in a data memory 34. Also, the EFM demodulation and syndrome calculator 20 calculates a syndrome per codeword using inner parity (PI) data during EFM-demodulation, and stores flags indicating whether there is an error in a corresponding codeword, in a flag memory 38. An ECC decoder 22 error-correction-decodes demodulated signals stored in the memory 34 in an ECC block unit, based on the syndrome calculated by the EFM demodulation and syndrome calculator 20.

The DVD system of FIG. 1 includes an MPEG-2 decoder 24 and/or a host interface 26 in accordance with the application in which the system is being used. If the DVD system is used to reproduce image data, the MPEG-2 decoder 24 receives the ECC-decoded signals and decodes the image data coded by the MPEG-2 standard, to thereby output the decoded signal to an image display apparatus such as television (TV). If the DVD system is used in a DVD-ROM system for reproducing data, the host interface 26 receives ECC-decoded signal from the ECC-decoder 22 and outputs the received data to an information processing system such as a computer (PC). An advanced technology attachment PC interface (ATAPI) can be used for the host interface 26.

Figure 2:
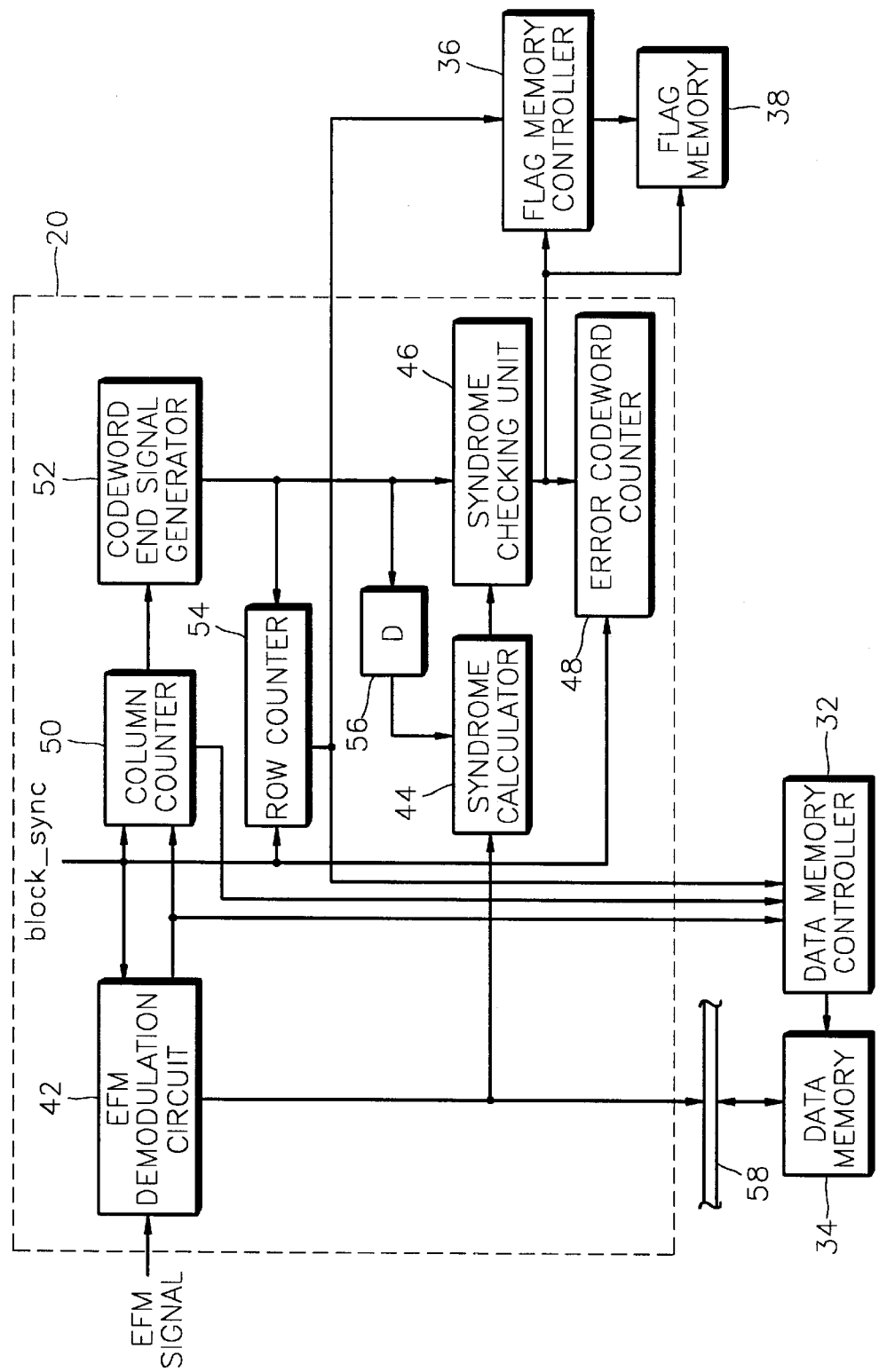
FIG. 2 is a detailed block diagram of an EFM-demodulation and syndrome calculator as shown in FIG. 1.

Referring to FIG. 2, the EFM demodulation and syndrome calculator 20 includes an EFM demodulation circuit 42, a syndrome calculator 44, a syndrome checking unit 46, an error codeword counter 48, a column counter 50, a codeword end signal generator 52, and a row counter 54. The data memory controller 32, the data memory 34, the flag memory controller 36 and the flag memory 38 of FIG. 1 are shown in FIG. 2.

The EFM demodulation circuit 42 receives the EFM signal, and EFM-demodulates the EFM signal in synchronization with an EFM block synchronization block_sync signal. The EFM demodulation circuit 42 outputs the demodulated signal to the data memory 34 via a data bus 58, such that the data memory 34 stores the EFM demodulated signal in an ECC block unit. Also, as each byte of the EFM demodulated signal is output, the EFM demodulation circuit 42 generates and outputs a write enable signal WE denoting that data on the data bus is the EFM demodulated signal.

Figure 8:
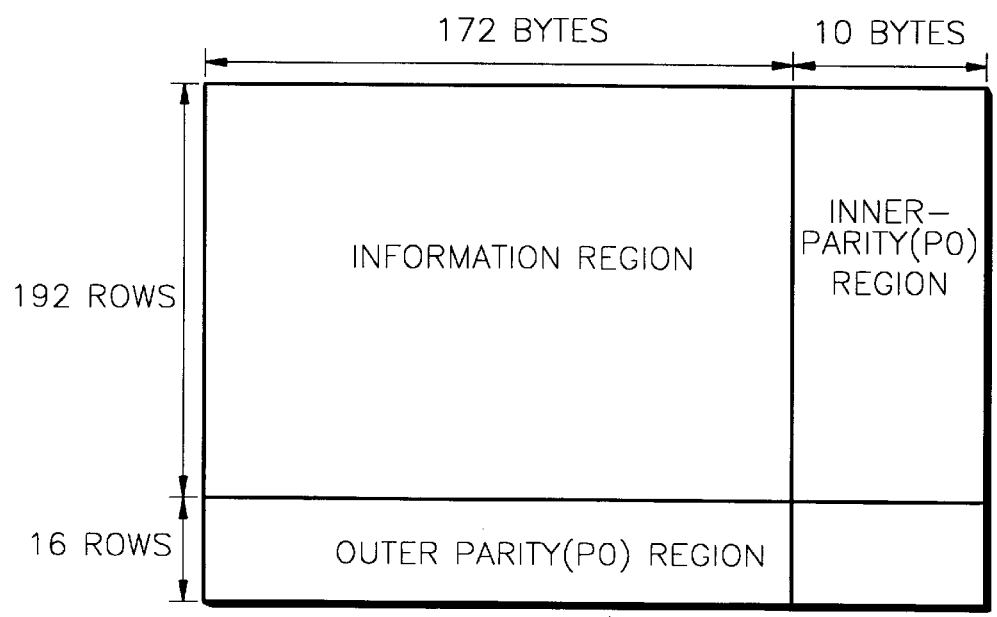
FIG. 8 shows the typical structure of an error correction code (ECC) block in a DVD.
Figure 7:
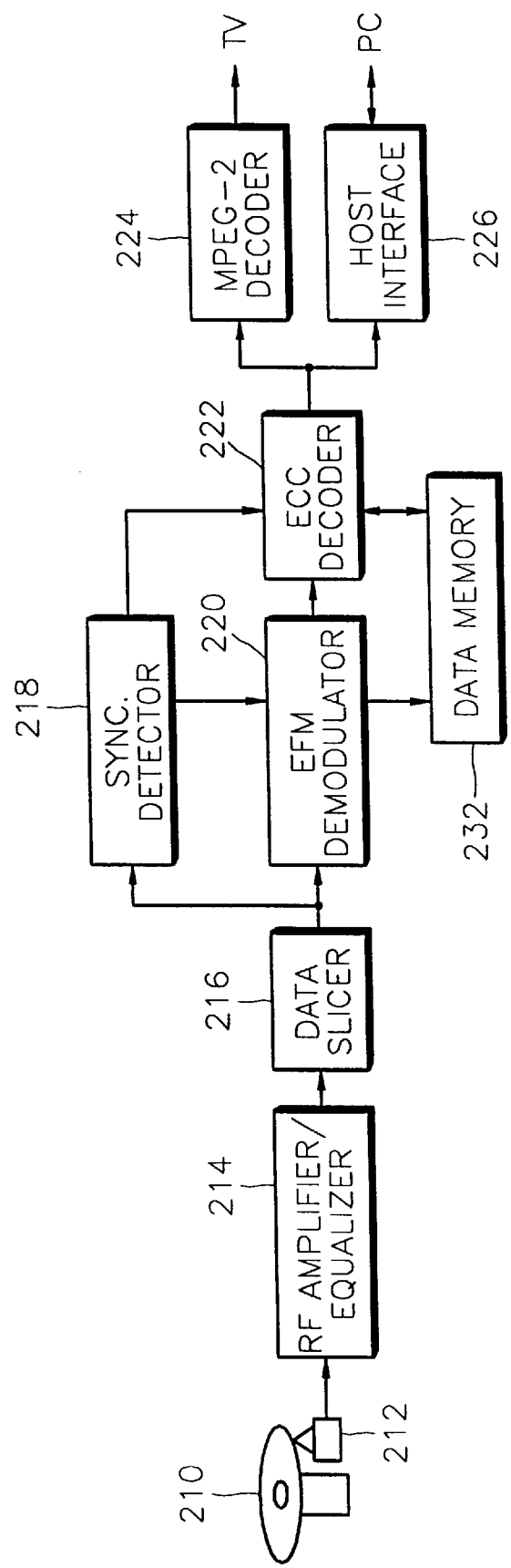
FIG. 7 is a block diagram of a conventional digital versatile disk (DVD) system.
Figure 9:
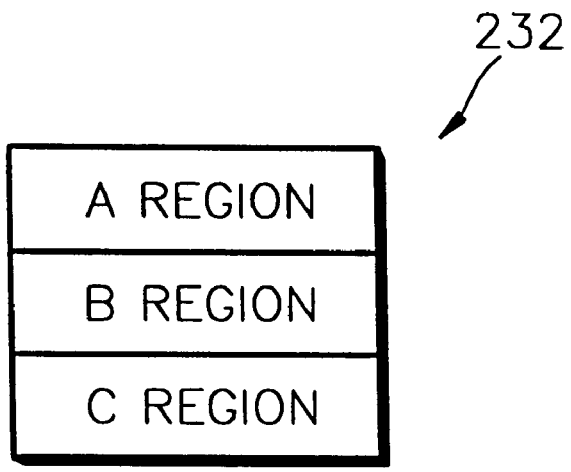
FIG. 9 is a diagram for illustrating division of a data memory for ECC decoding.
Figure 10:
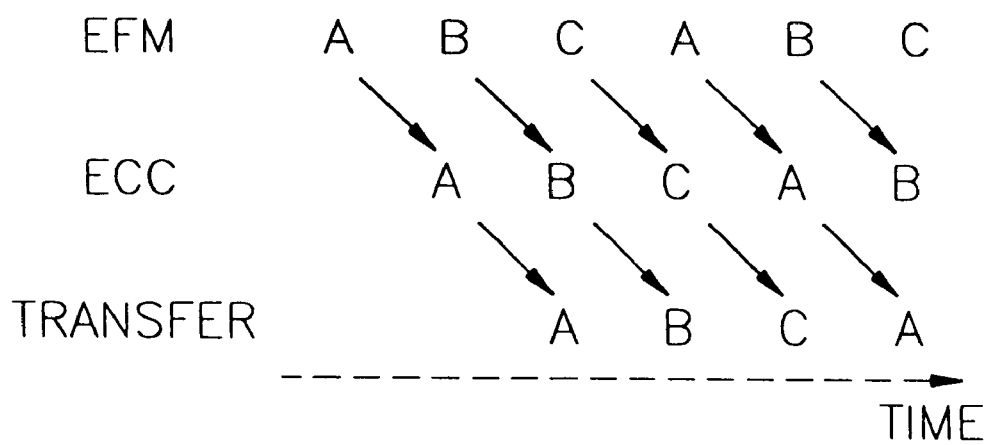
FIG. 10 illustrates an operation method of the memory of FIG. 9.
Figure 11:
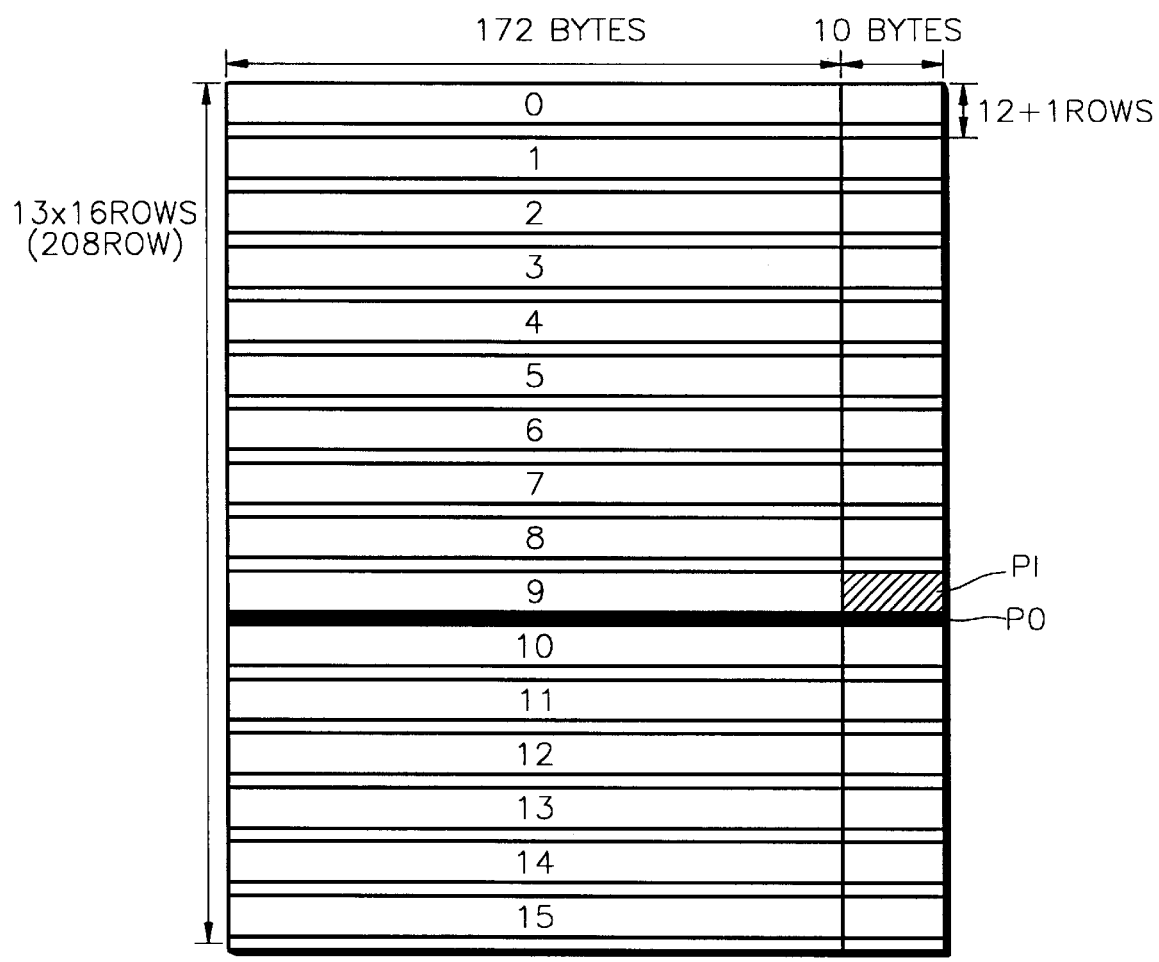
FIG. 11 shows an ECC block which is read out from a disk and EFM-demodulated, to illustrate interleaving of codewords in the ECC block.

The data memory controller 32 generates an address signal for the data memory 34 in response to the enable signal WE, and supplies the generated address signal to the data memory 34. Thus, the data memory 34 stores the EFM demodulated signal per ECC block. Meanwhile, arrangement of the EFM demodulated signal output by the EFM demodulation circuit 42 is not in the same format as that shown in FIG. 8. The EFM demodulated signal is row-interleaved to convert a burst error to a random error, as shown in FIG. 11. Thus, the data memory controller 32 generates row addresses in a sequence of 0~11, 192, 12~23, 193, . . . , without sequentially generating row address signals for the data memory 34. Thus, de-interleaved EFM-demodulated signals are stored in the data memory 34 in accordance with the format as shown in FIG. 2.

The syndrome calculator 44 receives EFM demodulated signals, and calculates a syndrome per PI codeword of the ECC block using inner parity (PI) data. The syndrome checking unit 46 receives syndromes from the syndrome calculator 44, and checks whether all syndrome coefficients are 0. If all of the syndrome coefficients are 0, the syndrome checking unit 46 outputs 0. If the syndrome coefficient has at least one or more other values than 0, the syndrome checking unit 46 outputs 1.

The error codeword counter 48 is reset by the block synchronization signal block_sync when a new ECC block begins to be processed. Then, the error codeword counter 48 up-counts only when the syndrome checking unit 47 outputs 1. Thus, the counted value in the error codeword counter 48 indicates the number of PI codewords that include errors in the ECC block. The number of codewords that include errors is used to determine an error correction method in the ECC decoder 22 of FIG. 1.

The column counter 50, the codeword end signal generator 52 and the row counter 54 count columns and rows of the ECC block, such that the syndrome calculator 44 calculates syndromes per codeword. The column counter 50 is a byte counter in the codewords counting 0~181. The column counter 50 is reset in response to the block synchronization signal block_sync and the codeword end signal from the codeword end signal generator 52. Also, the column counter receives a write enable signal WE, and up-counts in accordance with the write enable signal WE. Thus, the column counter 50 counts the number of bytes in the codeword, so that the counted value indicates a position of data output currently by the EFM demodulation circuit 42, i.e., a position of the horizontal (column) direction in the ECC block. The codeword end signal generator 52 generates the codeword end signal when the counted value in the column counter 50 becomes a maximum value of 181.

The row counter 54 is a codeword counter in the ECC block counting 0~207. The row counter 54 is reset in response to the block synchronization signal block_sync. Also, the row counter 54 up-counts in response to the codeword end signal. Thus, the counted value in the row counter 54 indicates a position of data output currently by the EFM demodulation circuit 42, i.e., the vertical (row) direction in the ECC block.

The delay unit 56 delays the codeword end signal by 1T (period of a synchronization clock), and the delayed signal is output as a reset signal for the syndrome calculator 44.

Figure 3:
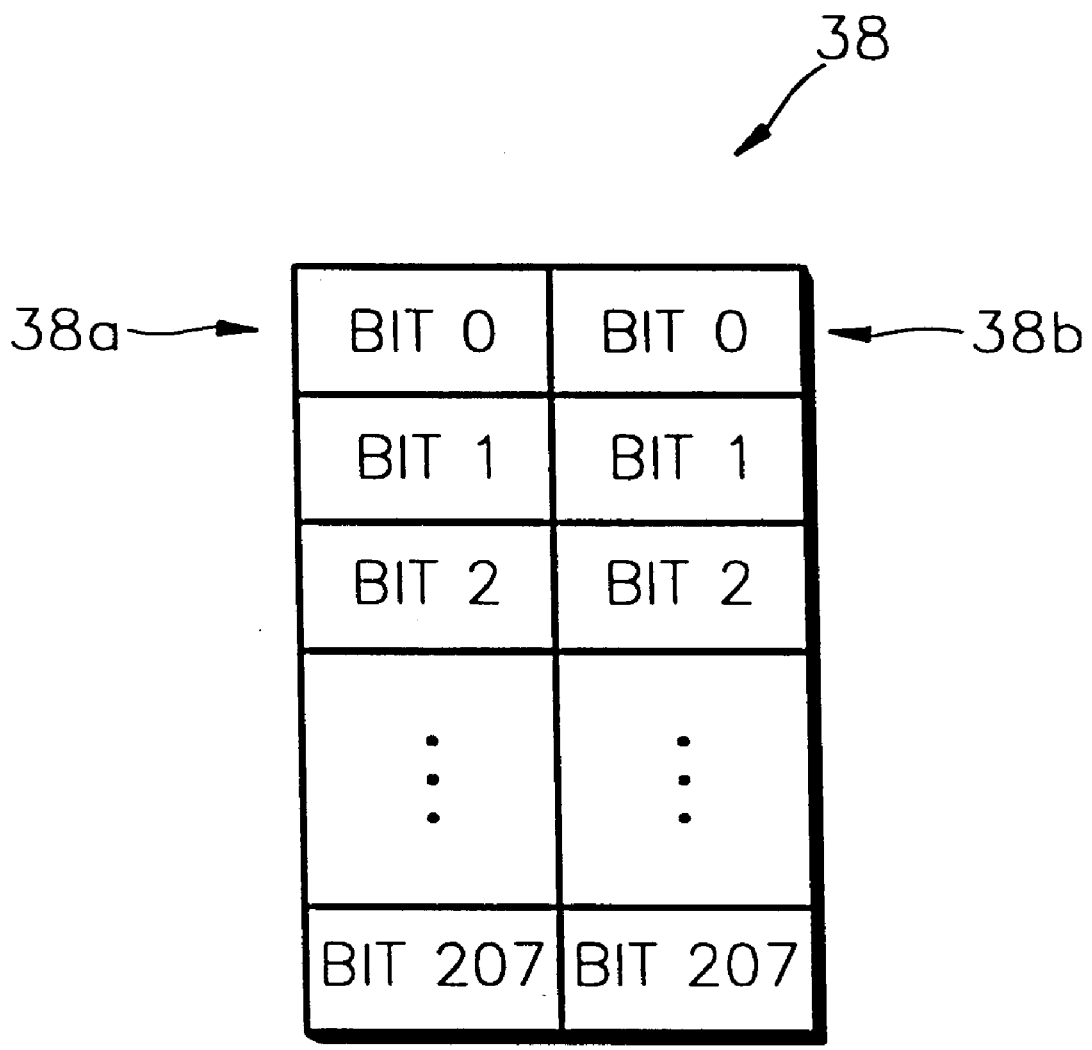
FIG. 3 is a detailed block diagram of one embodiment of the structure of a flag memory as shown in FIG. 2.

The flag memory 38 stores an output signal of the syndrome checking unit 46. The structure of one embodiment of the flag memory 38 is shown in FIG. 3. The flag memory 38 includes first and second regions 38a and 38b of 208-bits. The first region 38a is used to store the syndrome checking results when an initial ECC block is EFM-demodulated. When the second ECC block is EFM-demodulated, the second region 38b is used to store the syndrome checking results, where the syndrome checking results stored in the first region 38a is used for ECC-decoding. Also, when the third ECC block is EFM-demodulated, the first region 38a is used to store the syndrome checking results, where the syndrome checking results stored in the second region 38b is used for ECC decoding. In the first and the second regions 38a and 38b, bit 0 indicates whether first codeword of the ECC block includes errors, and bit 1 indicates whether the second codeword of the ECC block includes errors. In general, bit i indicates whether the (i+1)th codeword of the ECC block includes errors.

The flag memory controller 36 receives the codeword end signal and the counted row number output from the codeword end signal generator 52 and the row counter 54, respectively. The flag memory controller 36 generates an address with respect to the flag memory based on the counted row number when the codeword end signal is input and outputs the generated address to the flag memory 38, to thereby store the syndrome checking results of the syndrome checking unit 46 in a corresponding bit of the flag memory 36. At this time, the flag memory controller 36 may generate the address delayed by a predetermined delay time after receiving the codeword end signal and the counted row number, to meet timing. Also, since the row number of a row next to the row corresponding the syndrome checking result is received, the flag memory controller 36 uses a value obtained by subtracting 1 from the received row number for addressing. The flag memory controller 36, like the data memory controller 32, generates the address with respect to the flag memory 36 not sequentially but in a sequence of 0~11, 192, 12~23, 193, . . . Thus, the EFM demodulated signals are stored in the flag memory 36 corresponding to the format as shown in FIG. 2, like in the data memory 34.

Figure 4:
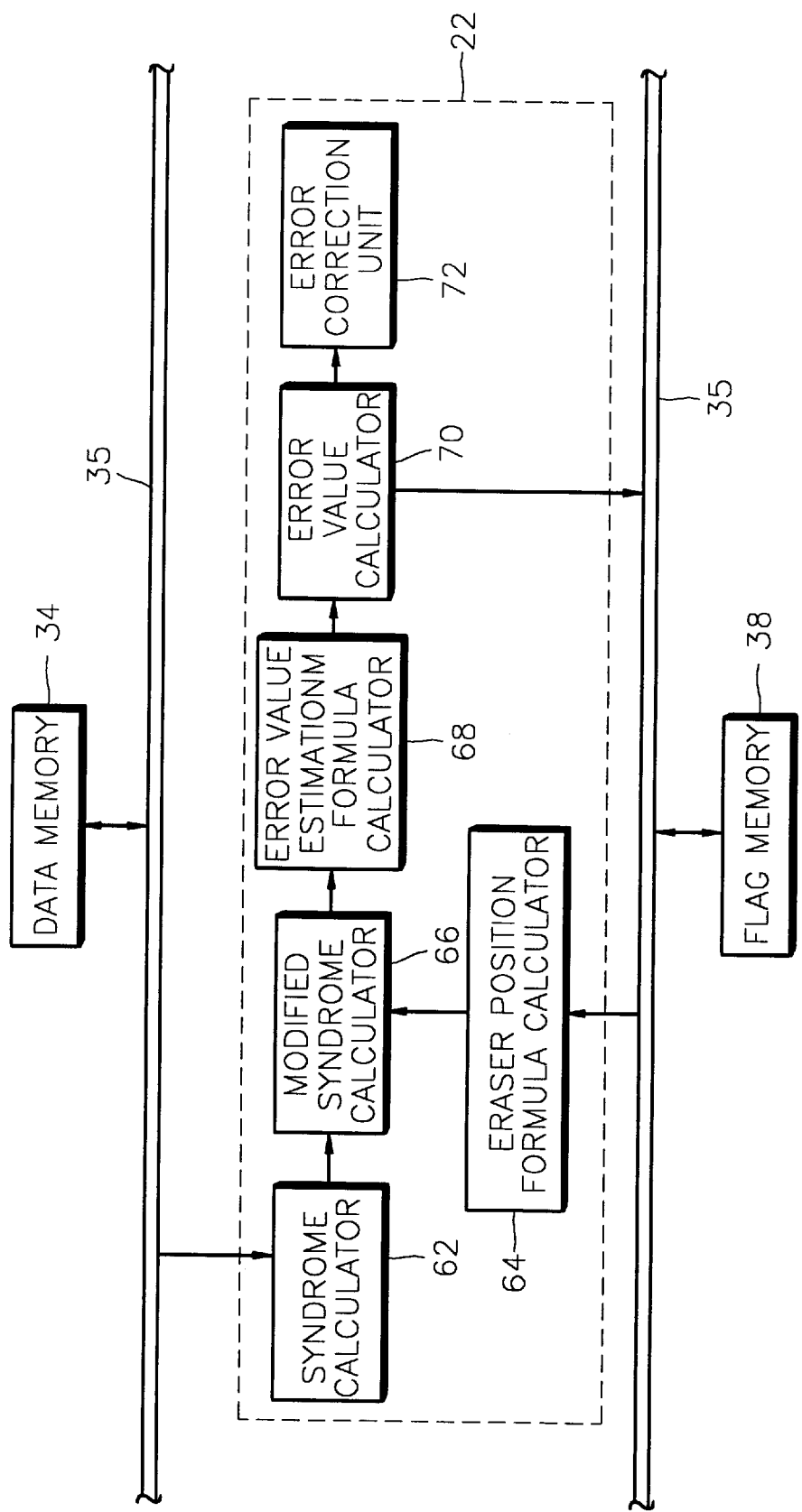
FIG. 4 is a detailed block diagram of one embodiment of the ECC decoder of FIG. 1.

FIG. 4 shows one embodiment of the ECC decoder of FIG. 1 in detail. The ECC decoder 22 includes a syndrome calculator 62, an eraser position formula calculator 64, a modified syndrome calculator 66, an error value estimation formula calculator 68, an error value calculator 70 and an error correction unit 72. The syndrome calculator 62 receives EFM-demodulated data stored in the data memory 34 via the data bus 35, and calculates syndromes indicating whether there are errors. The modified syndrome calculator 66 multiplies the syndrome formula from the syndrome calculator 62 by an eraser position formula from the eraser position formula calculator 64 to obtain the modified syndrome formula. The error value estimation formula calculator 68 calculates an error position formula and an error value estimation formula using the syndrome formula, the eraser formula and the modified syndrome formula. In one embodiment, a Euclidian algorithm or a Berlekamp algorithm can be used. The error value calculator 70 calculates the position where an error has been generated using the error position formula, and calculates the error value using the error position formula and the error value estimation formula. At this time, a Chien search algorithm may be used. Also, the error value calculator 70 determines whether it is possible to correct an error with respect to each of the codewords, and then stores the determined results as the eraser flag in the flag memory 38. The error correction unit 72 receives EFM-demodulated ECC block data from the data memory 34, and corrects errors in the data in accordance with the error position and the error value. The ECC decoder 22 includes a controller (not shown), which supplies a control signal required for each of the blocks of the ECC decoder 22 of FIG. 4, to thereby control the decoding process in accordance with the invention.

Figure 5A:
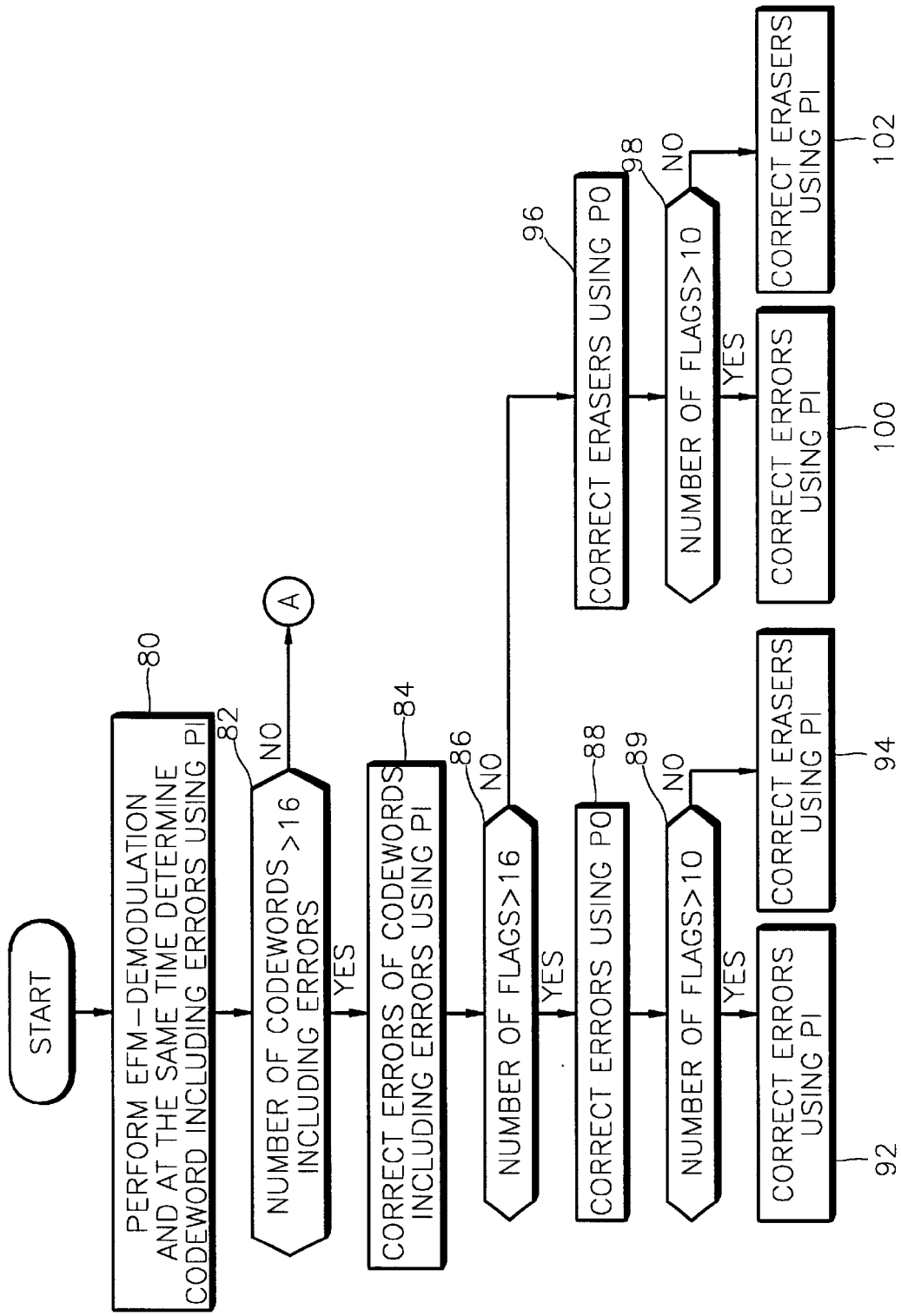
FIGS. 5A and 5B contain a flowchart for illustrating one embodiment of an error correction method according to the present invention.

One embodiment of an error correction method in an optical disk reproduction apparatus according to the present invention will be described with reference to the flowchart of FIGS. 5A and 5B. In step 80, an EFM demodulation and syndrome calculator 20 EFM-demodulates the EFM signals, and at the same time calculates syndromes of each of the inner-coded codewords using PI data. After the syndrome calculation, the EFM demodulation and syndrome calculator 20 determines whether the syndrome of each of the inner-coded codewords includes at least one 1 (or high) bit, and thus sets a flag indicating an error when there is the error as shown in FIG. 6. Also, the error codeword counter 48 in the EFM demodulation and syndrome calculator 20 counts inner-codewords including errors in the ECC block to maintain the counted value (step 80).

The ECC decoder 22 performs error-correction decoding with respect to the demodulated ECC block based on the number of codewords including errors. It is determined whether the number of codewords including errors is greater than 16 (step 82). As described above, in the codewords coded by the (208, 192, 17) Reed-Solomon code, a maximum of 16 erasers can be corrected. Thus, if it is determined in step 82 that the number of codewords including errors is greater than 16, the erasers cannot be corrected using outer parity (PO) data. Thus, the error correction can be performed using the PI data (step 84). At this time, the errors of only the codewords in which the flag has been set in step 80, i.e., the codewords including errors, instead of correcting the errors of all codewords, are corrected. In the conventional apparatus, syndrome calculation and error correction are performed for all rows. On the other hand, since the ECC decoder corrects errors using a previously calculated flag in the present invention, the memory access time and the calculation time are reduced.

In step 86, it is determined whether the number of codewords including errors is greater than 16, using the flag obtained from the error correction in step 82. If the number of codewords including errors is greater than 16, the errors are corrected using PO data (step 88). It is determined whether the number of codewords including errors is greater than 10, using the flag obtained from the error correction of step 88 (step 90). In the codeword coded by the (182, 172, 11) Reed-Solomon code, generally maximum 10 erasers can be corrected. Therefore, it is determined whether the number of outer-codewords including the errors is greater than 10 to determine whether the erasers of the PI data can be corrected using the flag. If the number of codewords including errors is greater than 10, the errors are corrected using the PI data (step 92). Unless the number of codewords including errors is greater than 16, the erasers are corrected using the PI data (step 94).

If it is determined in step 86 that the number of codewords including errors is greater than 16, the erasers are corrected using the PO data (step 96). It is determined whether the number of inner-codewords including errors is greater 10, using the flag obtained from eraser correction of step 96 (step 98). If the number of codewords including errors is greater 10, the errors are corrected using the PO data (step 100). Unless the number of codewords including errors is greater than 10, the erasers are corrected using the PI data (step 102).

If it is determined in step 82 that the number of codewords including errors is not greater than 16, the bit position where a flag is set is regarded as an eraser, and thus the erasers are corrected using outer parity (PO) data as shown in FIG. 6 (step 104). In the codeword coded by the (208, 192, 17) Reed-Solomon code, maximum 16 erasers can be corrected, so that the erasers are within a correctable range.

Figure 5B:
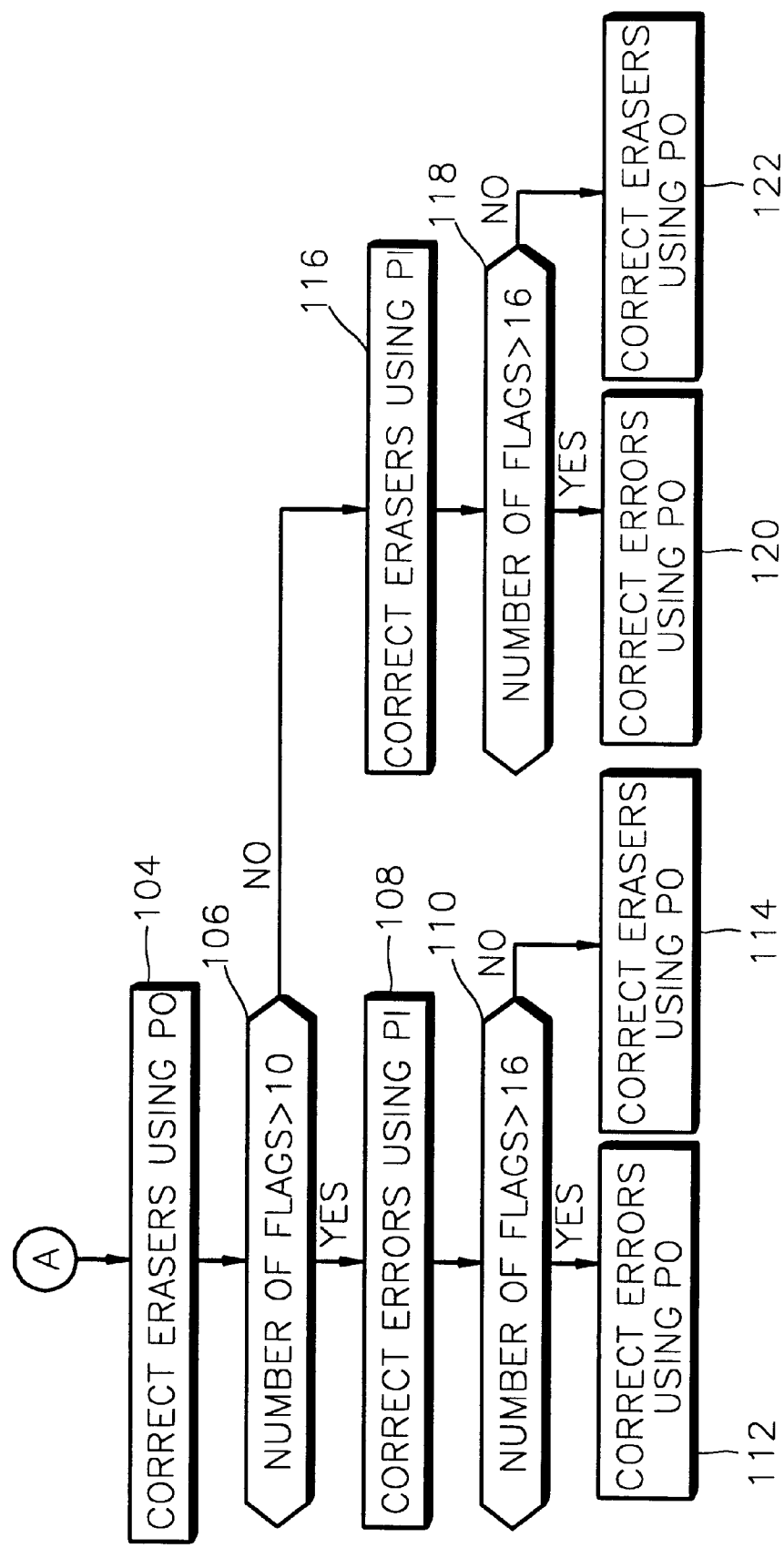
Figure 6:
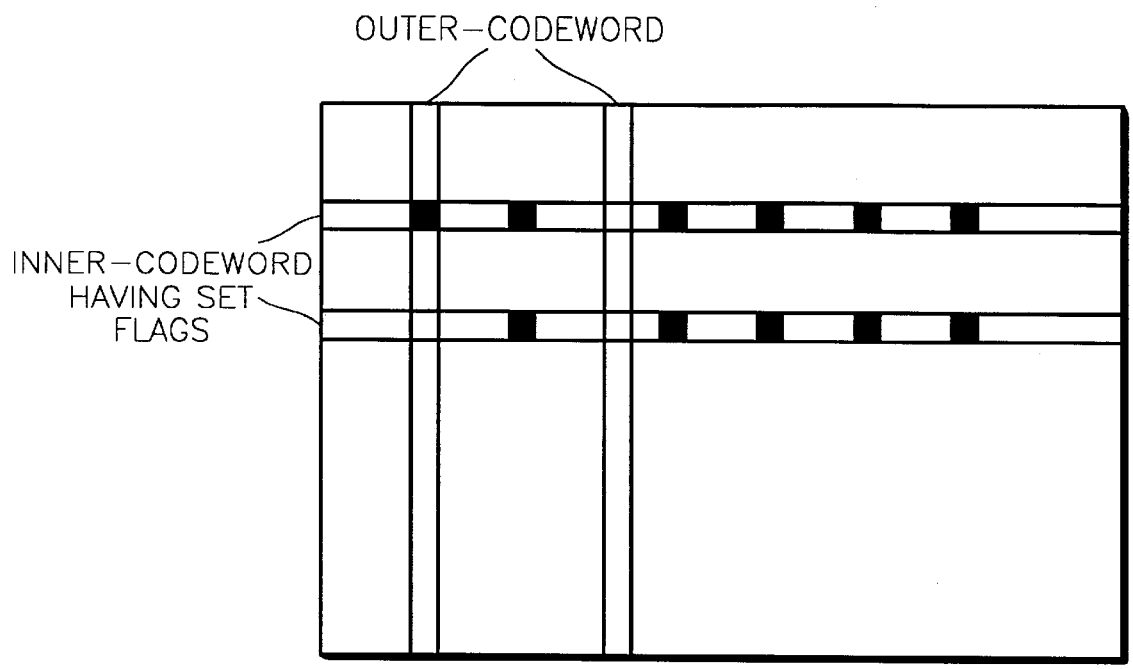
FIG. 6 is a flow diagram for illustrating the steps of setting a flag and correcting errors and erasers according to the error correcting method of the present invention.

Referring to FIG. 5B, in step 106, it is once again determined whether the number of codewords including errors is greater than 10, using the flag obtained from error correction of the step 104. If the number of codewords including errors is greater than 10, the errors are corrected using the PI data (step 108). It is determined whether the number of codewords including errors is greater than 16, using the flag obtained from the error correction of step 108 (step 110). If the number of codewords including errors is greater 16, the errors are corrected using the PO data (step 112). Unless the number of codewords including errors is greater than 16, erasers are corrected using PO data (step 114).

If it is determined in step 106 that the number of codewords including errors is greater than 10, the erasers are corrected using PI data (step 116). It is determined whether the number of inner-codewords including errors is greater than 16, using the flag obtained from the eraser correction of step 116 (step 118). If the number of codewords including errors is greater than 16, the errors are corrected using PO data (step 120). Unless the number of codewords including errors is greater than 16, the erasers are corrected using PO data (step 122).

As described above, according to the present invention, eraser flags are set by calculating syndromes per codeword during EFM-demodulation, and then error correction coding is performed using the eraser flag after the EFM-demodulation, to thereby reduce the access times with respect to the data memory in error correcting and thus reduce the error correction time. Thus, the access speed for the data stored in the DVD is increased.

While this invention has been particularly shown and described with references to preferred embodiments thereof, it will be understood by those skilled in the art that various changes in form and details may be made therein without departing from the spirit and scope of the invention as defined by the appended claims.

For example, the EFM demodulation and syndrome calculator 20 may not include the error codeword counter 48. Here, the controller of the ECC decoder 22 calculates the number of the codewords including errors by adding the flags stored in the flag memory 38 to use the number of codewords for decoding.

What is claimed is:

1. An optical disk reproducing system of the type for reading signals stored in the optical disk, restoring EFM signals, demodulating the EFM signals to restore predetermined error correction block double-coded by coding a first predetermined number of messages each having a second predetermined number of symbols to first codewords, using first parity data and to a second codewords using second parity data in the direction vertical to coding by the first parity data, and error-correction-decoding in a unit of error correction block, the system comprising:

a data memory for storing EFM signals and the EFM-demodulated signals in the unit of an error correction block;

an EFM demodulation and syndrome calculator for EFM-demodulating the EFM signals to output the EFM-demodulated signals to the data memory, and for calculating syndromes of the EFM-demodulated signals in the unit of the first codeword and outputting a flag indicating whether there is an error;

a flag memory for storing the first predetermined number of flags with respect to each of the first predetermined number of the first codewords; and an error corrector for error-correction-decoding the EFM-demodulated signal stored in the data memory in the unit of an error correction block based on the flags stored in the flag memory, wherein the EFM demodulation and syndrome calculator comprises:

an EFM demodulation circuit for receiving the EFM signals, for outputting the EFM-demodulated signals, and for outputting a write enable signal, indicating that data on the data bus is the EFM demodulated signals, whenever the demodulated signal is output;

a syndrome calculator for receiving the EFM-demodulated signals, and for calculating syndromes with respect to each of the first codewords; and a syndrome checking unit for receiving syndromes from the syndrome calculator, and for checking whether all syndrome coefficients are 0, to output a flag having a value of 0 if all syndrome coefficients are 0 and a value of 1 if the syndrome coefficients have at least one 1.

2. The optical disk reproducing system of claim 1, wherein the EFM demodulation and syndrome calculator further comprises:

a column counter for up-counting whenever an EFM demodulation signal of one byte is output from the EFM demodulation circuit, to output the counted value, and reset by a codeword end signal;

a codeword end signal generator for receiving the counted value from the column counter, and for generating the codeword end signal when the counted value is equal to the second predetermined number; and a row counter for up-counting in response to the codeword end signal, the row counter being reset when the EFM demodulation circuit completes EFM-demodulation with respect to one error correction block, and wherein the syndrome checking unit generates the flag in response to the codeword end signal.

3. The optical disk reproducing system of claim 1, wherein the EFM demodulation and syndrome calculator further comprises an error codeword counter for receiving the flag from the syndrome checking unit and for up-counting only when the flag is 1, and reset when EFM-demodulation with respect to a new error correction block begins.

4. A method for EFM demodulation and error correction decoding of an optical disk reproducing system restoring EFM-demodulated EFM signals, demodulating the EFM signals to restore predetermined error correction block double-coded by coding a first predetermined number of messages each having a second predetermined number of symbols to first codewords, using first parity data and to a second codewords using second parity data in the direction vertical to coding by the first parity data, and error-correction-decoding in a unit of error correction block, comprising the steps of:

(a) EFM-demodulating the EFM signals;

(b) calculating syndromes of the EFM-demodulated signal in a unit of the first codeword to detect an error, and setting a first flag when an error is detected; and (c) error-correction-decoding the EFM-demodulated signal in a unit of the error correction block using the first flag for the first codewords, wherein step (c) comprises the steps of:

(d) determining whether the number of first codewords in which the first flag is set is greater than a third predetermined number;

(e) correcting errors of the first codewords, when the number of the first codewords including errors is greater than the third predetermined number in step (d); and (f) correcting erasers of the second codewords using the first flag, when the number of the codewords including errors is not greater than the third predetermined number in step (d).

5. The method of claim 4, wherein a second flag indicating first codewords including errors is generated, during error correction of the step (e), and step (e) further comprises the substeps of:

e1) determining whether the number of second flags is greater than the third predetermined number;

e2) correcting errors of the second codewords, if the number of the second flags is greater than the third predetermined number in step (e1); and e3) correcting erasers of the second codewords, if the number of second flags is not greater than the third predetermined number in step (e1).

6. The method of claim 4, wherein a second flag indicating second codewords including errors is generated, during eraser correction of the step (f), and step (f) further comprises the substeps of:

f1) determining whether the number of second flags is greater than a fourth predetermined number;

f2) correcting errors of the first codewords, if the number of second flags is greater than the fourth predetermined number in step (f1); and f3) correcting erasers of the first codewords, if the number of second flags is not greater than the fourth predetermined number in step (f1).

* * * * *